United States Patent
Hsieh et al.

(10) Patent No.: US 11,348,811 B2
(45) Date of Patent: May 31, 2022

(54) THERMAL CHAMBER EXHAUST STRUCTURE AND METHOD

(71) Applicant: TAIWAN SEMICONDUCTOR MANUFACTURING COMPANY, LTD., Hsinchu (TW)

(72) Inventors: Hsien-Chang Hsieh, Hsinchu (TW); Chun-Chih Lin, Taipei (TW); Tah-Te Shih, Hsinchu (TW); Wen-Hsong Wu, Hsinchu (TW); Chune-Te Yang, Erlin Township (TW); Yu-Jen Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 92 days.

(21) Appl. No.: 16/519,504

(22) Filed: Jul. 23, 2019

(65) Prior Publication Data

US 2019/0348309 A1 Nov. 14, 2019

Related U.S. Application Data

(63) Continuation of application No. 15/694,161, filed on Sep. 1, 2017, now Pat. No. 10,366,909.

(60) Provisional application No. 62/537,604, filed on Jul. 27, 2017.

(51) Int. Cl.
| | |
|---|---|
| *F01N 13/08* | (2010.01) |
| *H01L 21/67* | (2006.01) |
| *F27D 17/00* | (2006.01) |
| *F23J 13/02* | (2006.01) |

(52) U.S. Cl.
CPC ........ *H01L 21/67109* (2013.01); *F23J 13/02* (2013.01); *F27D 17/002* (2013.01); *H01L 21/67017* (2013.01); *H01L 21/67103* (2013.01); *F23J 2900/13001* (2013.01)

(58) Field of Classification Search
CPC .. F27B 1/005; F27B 7/33; F27B 9/047; F27B 3/005; F27D 17/008; F01N 3/2892; F01N 13/141; F01N 13/08; Y10S 438/913; Y10S 438/935
See application file for complete search history.

(56) References Cited

U.S. PATENT DOCUMENTS

| | | | | |
|---|---|---|---|---|
| 4,363,353 A | * | 12/1982 | Pranaitis | ............... F28D 7/0058 165/128 |
| 5,787,821 A | * | 8/1998 | Bhat | ...................... B03C 3/017 110/216 |
| 5,928,426 A | * | 7/1999 | Aitchison | .............. B01J 19/126 118/715 |

(Continued)

*Primary Examiner* — Gregory A Wilson
(74) *Attorney, Agent, or Firm* — Hauptman Ham, LLP

(57) ABSTRACT

An exhaust structure includes an intake section which includes an inlet, an output section which includes an outlet, and a piping section coupled to the intake section and the output section at a section interface. The piping section includes a first inner diameter from the intake section to the output section, wherein one of the intake section or the output section has a second inner diameter at the section interface. The second inner diameter includes a same value as a value of the first inner diameter. A plurality of smoothing layers are configured to resist turbulence and condensation produced by a flow of one or more gasses in the intake section, the output section, and the piping section.

20 Claims, 3 Drawing Sheets

(56) References Cited

U.S. PATENT DOCUMENTS

| | | | |
|---|---|---|---|
| 6,927,363 B1* | 8/2005 | Kao | F27B 17/0025 |
| | | | 118/50.1 |
| 8,303,703 B2* | 11/2012 | Saiki | C23C 18/127 |
| | | | 106/287.1 |
| 8,460,466 B2* | 6/2013 | Gurary | H01L 21/68764 |
| | | | 118/715 |
| 8,658,937 B2* | 2/2014 | Harte | H01L 21/02087 |
| | | | 219/121.68 |
| 8,939,397 B2* | 1/2015 | Brunetti | H01L 35/30 |
| | | | 244/53 R |
| 9,188,251 B2* | 11/2015 | Hayashi | C09D 5/4484 |
| 9,391,009 B2* | 7/2016 | Jang | H01L 25/0652 |
| 9,616,396 B2* | 4/2017 | Nande | B01F 3/04049 |
| 9,644,516 B1* | 5/2017 | Chiruta | B01F 3/04049 |
| 9,745,879 B2* | 8/2017 | Shiva | F01N 3/208 |
| 9,890,682 B2* | 2/2018 | Clayton, Jr. | F01N 3/2066 |
| 9,896,761 B2* | 2/2018 | Hara | C23C 16/46 |
| 2001/0038813 A1* | 11/2001 | Gieshoff | B01D 53/8631 |
| | | | 423/239.1 |
| 2010/0146948 A1* | 6/2010 | DaCosta | F01N 3/2066 |
| | | | 60/295 |
| 2013/0000285 A1* | 1/2013 | Prior | B23K 1/0012 |
| | | | 60/320 |
| 2013/0216699 A1* | 8/2013 | Yamaguchi | H01L 21/76898 |
| | | | 427/97.8 |

* cited by examiner

THERMAL CHAMBER EXHAUST STRUCTURE AND METHOD

PRIORITY CLAIM

The present application is a continuation of U.S. application Ser. No. 15/694,161, filed Sep. 1, 2017, which claims the priority of U.S. Provisional Application No. 62/537,604, filed Jul. 27, 2017, which are incorporated herein by reference in their entireties.

BACKGROUND

In integrated circuit (IC) manufacturing, individual IC elements are formed and tested using various pieces of manufacturing equipment to perform multiple operations. In some operations, substrates on which the ICs are built are heated to cause or accelerate modifications to the materials used to form the ICs.

To heat a substrate, a thermal chamber is often used to control temperature and an ambient environment of the substrate. For manufacturing operations that involve gaseous materials, control of the ambient environment can include expelling one or more gasses through an exhaust structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
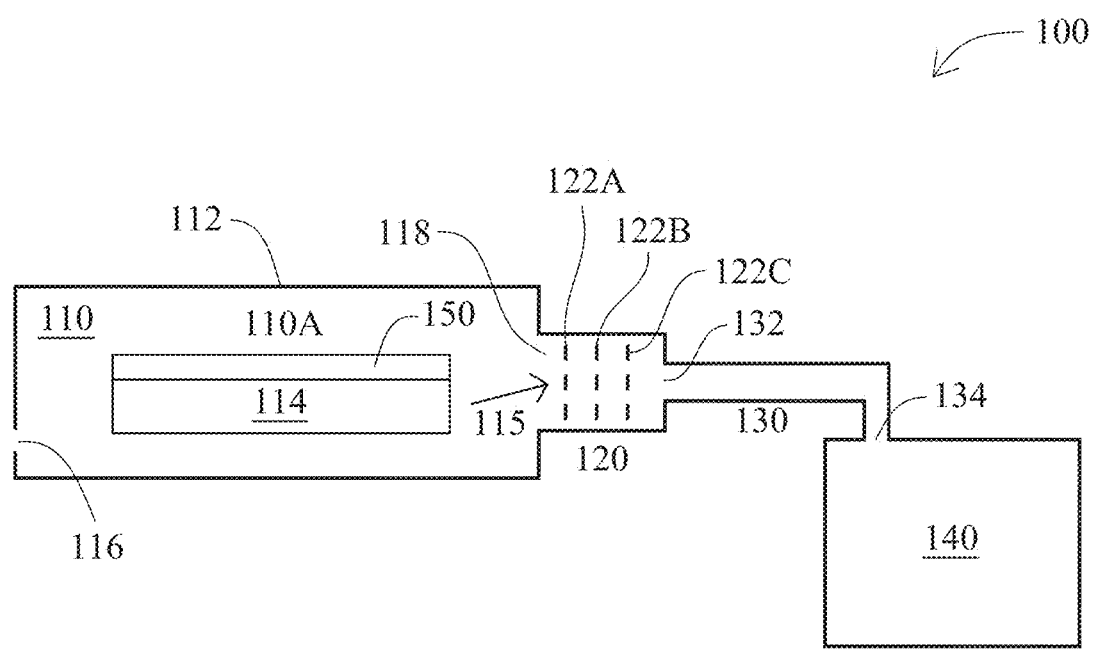
FIG. 1 is a diagram of a thermal chamber system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an exhaust structure of a thermal chamber system includes an intake section, a piping section, and an output section. Each section includes a high thermal conductivity material such that a high thermal conductivity path conducts heat from the inlet to the outlet. A vapor exhausted through the exhaust structure is cooled less than vapors exhausted through structures without a high thermal conductivity path, thereby reducing buildup of material that condenses from the vapor as it cools. In some embodiments, condensate material buildup is further reduced by a material of the exhaust structure having a low emissivity coefficient. In some embodiments, condensate material buildup is further reduced by the use of a uniform inner diameter and/or a smoothing layer and/or a curved cross-sectional profile.

FIG. 1 is a diagram of a thermal chamber system 100, in accordance with some embodiments. FIG. 1 is a cross-sectional view of thermal chamber system 100 and a substrate 150, positioned within thermal chamber system 100.

Thermal chamber system 100 includes a thermal chamber 110, a flow regulator 120 mechanically coupled with thermal chamber 110, an exhaust structure 130 mechanically coupled with flow regulator 120, and a receptacle 140.

Thermal chamber 110 is a structure configured to apply heat to a substrate, e.g., substrate 150, contained within thermal chamber 110. Thermal chamber 110 includes an enclosure 112, a hot plate 114, a chamber inlet 116, and a chamber outlet 118.

Enclosure 112 is a mechanical or electromechanical assembly that defines a volume and is configured to contain a gas or plurality of gasses within the defined volume. In some embodiments, enclosure 112 includes components (not separately labeled) configured as sidewalls, a bottom, and a top, or cover. In various embodiments, one or more components of enclosure 112 are configured to enable access to the defined volume, thereby allowing transportation of one or more substrates, e.g., substrate 150, into and out of thermal chamber 110.

Hot plate 114 is a disk or similar structure having a substantially planar upper surface (not labeled) suitable for supporting and applying heat to a substrate, e.g., substrate 150. In various embodiments, hot plate 114 includes electrical and/or mechanical components (not shown) configured to generate heat, control heating temperatures, and facilitate heat transfer and substrate transportation.

In some embodiments, hot plate 114 is capable of generating and applying heat at a temperature ranging from 50° C. to 250° C. In some embodiments, hot plate 114 is capable of generating and applying heat at a temperature ranging from 50° C. to 400° C. In some embodiments, hot plate 114 is capable of generating and applying heat at a temperature greater than 400° C.

In some embodiments, thermal chamber 110 does not include hot plate 114, and instead includes a structure (not shown) suitable for supporting a substrate, e.g., substrate 150, without generating or applying heat to the substrate. In some embodiments in which thermal chamber 110 does not include hot plate 114, thermal chamber 110 includes a separate heating element (not shown) capable of generating and applying heat to a substrate, e.g., substrate 150.

Chamber inlet 116 is one or more openings in enclosure 112 configured to allow one or more gasses to enter thermal chamber 110. In the embodiment depicted in FIG. 1, chamber inlet 116 is a single opening. In some embodiments, chamber inlet 116 includes one or more vents in enclosure 112, thereby enabling one or more gasses to be drawn into thermal chamber 110. In some embodiments, chamber inlet 116 includes one or more mechanical fixtures configured to attach to one or more purging structures, thereby enabling one or more gasses to be forced into thermal chamber 110.

Chamber outlet 118 is one or more openings in enclosure 112 configured to allow one or more gasses to exit thermal chamber 110. In the embodiment depicted in FIG. 1, chamber outlet 118 is a single opening mechanically coupled with flow regulator 120. In some embodiments, chamber outlet 118 includes one or more vents in enclosure 112, thereby enabling one or more gasses to be forced out of thermal chamber 110. In some embodiments, chamber outlet 118 includes one or more mechanical fixtures configured to attach to one or more external structures, e.g., flow regulator 120, thereby enabling one or more gasses to be forced or drawn out of thermal chamber 110.

In operation, a pressure difference is generated between chamber inlet 116 and chamber outlet 118 such that one or more gasses flow into thermal chamber 110 through chamber inlet 116, and one or more gasses flow out of thermal chamber 110 through chamber outlet 118. In some embodiments, in operation, the one or more gasses flowing out of thermal chamber 110 include one or more vapors emitted from a substrate, e.g., substrate 150, as a result of heating the substrate.

In some embodiments, thermal chamber 110 does not include chamber inlet 116, and, in operation, one or more gasses flow out of thermal chamber 110 through chamber outlet 118 based on increased pressure resulting from heat generated by hot plate 114. In some embodiments in which thermal chamber 100 does not include chamber inlet 116, in operation, one or more gasses flow out of thermal chamber 110 through chamber outlet 118 as a result of heating a substrate, e.g., substrate 150. In some embodiments in which thermal chamber 100 does not include chamber inlet 116, in operation, one or more gasses that flow out of thermal chamber 110 through chamber outlet 118 as a result of heating a substrate, e.g., substrate 150, include one or more vapors emitted from the substrate.

Thermal chamber 110 is configured to provide a low thermal resistance path 115 between hot plate 114 and chamber outlet 118. In some embodiments, hot plate 114 and chamber outlet 118 are proximate to each other, and low thermal resistance path 115 is a portion of a volume of the one or more gasses present in thermal chamber 110, such that, in operation, heat is transferred by convection from hot plate 114 to chamber outlet 118. In some embodiments, thermal chamber 110 includes an additional component (not shown) that includes a metal or other material capable of providing low thermal resistance path 115.

In some embodiments, thermal chamber system 100 is a component of an IC manufacturing system, and thermal chamber system 100 is configured to perform one or more IC manufacturing operations on one or more substrates, e.g., substrate 150. In some embodiments, thermal chamber system 100 is configured to perform a soft bake operation in which a bottom anti-reflective coating (BARC) is dehydrated, and a vapor is emitted. In various embodiments, thermal chamber system 100 is configured to perform one or more of a photoresist processing operation or an etching operation.

In some embodiments, in operation, one or more emitted vapors include a solvent. In some embodiments, in operation, one or more emitted vapors include one or more additives.

In some embodiments, thermal chamber system 100 is configured to perform one or more operations on substrate 150, and substrate 150 includes one or more of silicon, gallium arsenide, silicon germanium, SiC, or another semiconductor material or compound semiconductor material suitable as a basis for forming ICs. In various embodiments, substrate 150 includes one or more ICs, non-limiting examples of which include memory, logic, processor, and/or communication circuits.

Flow regulator 120 is a structure configured to regulate flow of the one or more gasses exiting thermal chamber 110 through chamber outlet 118. Flow regulator 120 is mechanically coupled with thermal chamber 110 at chamber outlet 118.

Flow regulator 120 includes plates 122A, 122B, and 122C. Each of plates 122A, 122B, and 122C is oriented perpendicular to a direction in which the one or more gasses exit thermal chamber 110 through chamber outlet 118 and includes a plurality of openings through which the one or more gasses flow. The size, spacing, and orientation of the plurality of openings distributed throughout plates 122A, 122B, and 122C, in operation, limit the flow of the one or more gasses though chamber outlet 118, thereby enabling control of gas pressure within thermal chamber 110.

Flow regulator 120 includes one or more materials capable of being mechanically coupled with thermal chamber 110 and exhaust structure 130, and of limiting the flow of the one or more gasses at temperatures consistent with the temperature range of hot plate 114. In various embodiments, flow regulator 120 includes iron, an iron alloy, steel, aluminum, an aluminum alloy, or another suitable metal or other material.

Exhaust structure 130 includes an exhaust inlet 132 mechanically coupled with flow regulator 120, and an exhaust outlet 134. Exhaust structure 130 is configured to, in operation, transport the one or more gasses through exhaust inlet 132 to exhaust outlet 134, and to expel the one or more gasses into receptacle 140. In some embodiments, exhaust structure 130 is exhaust structure 200, discussed below with respect to FIG. 2.

Exhaust structure 130 includes one or more materials having a high thermal conductivity, and is thereby configured to provide a high thermal conductivity path from exhaust inlet 132 to exhaust outlet 134. In some embodiments, exhaust structure 130 includes one or more materials having thermal conductivity greater than 200 Watts per meter-Kelvin (W/m-K). In some embodiments, exhaust structure 130 includes one or more of aluminum, gold, silver, copper, graphene, diamond, or another material having a thermal conductivity greater than 200 W/m-K.

In some embodiments, exhaust structure 130 includes one or more materials having a low emissivity coefficient. In some embodiments, exhaust structure 130 includes one or more materials having an emissivity coefficient ranging from 0.01 to 0.10. In some embodiments, exhaust structure 130 includes one or more of aluminum, gold, silver, copper, or another material having an emissivity coefficient less than 0.10.

In the embodiment depicted in FIG. 1, exhaust structure 130 is mechanically coupled with receptacle 140 at exhaust outlet 134, thereby enabling the one or more gasses expelled through exhaust outlet 134 to be received into receptacle 140. In some embodiments, exhaust outlet 134 is positioned adjacent to receptacle 140 without exhaust structure 130 being mechanically coupled with receptacle 140, thereby enabling the one or more gasses expelled through exhaust outlet 134 to be received into receptacle 140.

Receptacle 140 is a container suitable for receiving the one or more gasses expelled through exhaust outlet 134. In some embodiments, receptacle 140 is a container configured to receive one or more gasses expelled through a plurality of exhaust outlets, e.g., exhaust outlet 134, of a corresponding plurality of thermal chamber systems, e.g., thermal chamber system 100. In some embodiments, thermal chamber system 100 does not include receptacle 140, and, in operation, the one or more gasses expelled through exhaust outlet 134 are received by another exhaust structure or are discharged into an ambient environment.

In some embodiments, receptacle 140 is configured to contain material condensed from the one or more gasses expelled through exhaust outlet 134. In some embodiments, receptacle 140 is configured to contain a solid condensate material such as a powder. In some embodiments, receptacle 140 is configured to contain a liquid condensate material.

As discussed above with respect to FIG. 1, thermal chamber system 100 is configured to communicatively couple thermal chamber 110 with exhaust outlet 134 through chamber outlet 118, flow regulator 120, and exhaust inlet 132. In some embodiments, thermal chamber system 100 does not include flow regulator 120, and thermal chamber system 100 is configured to communicatively couple thermal chamber 110 with exhaust outlet 134 through chamber outlet 118 directly communicatively coupled with exhaust inlet 132.

As discussed above with respect to FIG. 1, thermal chamber system 100 is configured to provide a high thermal conductivity path from hot plate 114 to exhaust outlet 134 through low thermal resistance path 115, flow regulator 120, and exhaust structure 130. In some embodiments in which thermal chamber system 100 does not include flow regulator 120, thermal chamber system 100 is configured to provide a high thermal conductivity path from hot plate 114 to exhaust outlet 134 through low thermal resistance path 115 directly thermally coupled with exhaust structure 130.

Thermal chamber system 100 is thereby configured so that, compared to thermal chamber systems that do not include a high thermal conductivity path from a hot plate to an exhaust outlet, a temperature gradient between hot plate 114 and exhaust outlet 134 is reduced. By having a reduced temperature gradient, buildup of condensate material in exhaust structure 130 is reduced compared to approaches that do not include a high thermal conductivity path from a hot plate to an exhaust outlet, thereby reducing cleaning frequency and improving control of gas flow out of thermal chamber 110.

Compared to approaches that use a separate heat source to heat an exhaust structure, thermal chamber system 100 reduces a temperature gradient between hot plate 114 and exhaust outlet 134 using less energy.

In some embodiments in which exhaust structure 130 includes one or more low emissivity coefficient materials, heat transfer to one or more gasses in exhaust structure 130 is lowered and the temperature gradient is further reduced compared to approaches that do not include one or more low emissivity coefficient materials in an exhaust structure, thereby further reducing cleaning frequency and improving control of gas flow out of thermal chamber 110.

Table 1 below provides a non-limiting example of a temperature gradient of thermal chamber system 100 discussed above with respect to FIG. 1. Table 1 includes example temperatures at locations discussed above and at a location 110A directly above hot plate 114 and a substrate, e.g., substrate 150.

TABLE 1

| Location | Temperature (° C.) |
|---|---|
| Hot Plate 114 | 215 |
| Location 110A | 154 |
| Chamber Outlet 118 | 149 |
| Plate 122A | 138 |
| Plate 122C | 132 |
| Exhaust Inlet 132 | 116 |
| Exhaust Outlet 134 | 110 |

Figure 2:
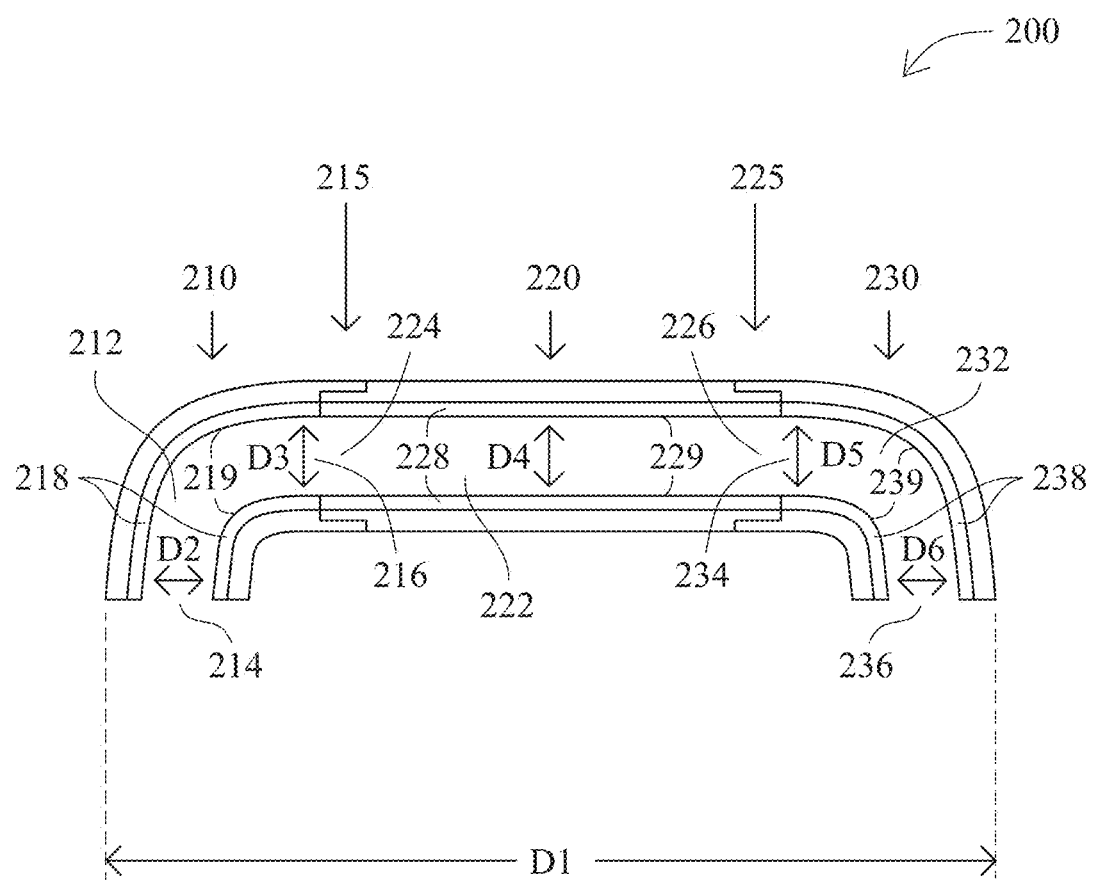
FIG. 2 is a diagram of an exhaust structure, in accordance with some embodiments.

FIG. 2 is a diagram of an exhaust structure 200, in accordance with some embodiments. Exhaust structure 200 is usable as exhaust structure 130, discussed above with respect to thermal chamber system 100 and FIG. 1.

Exhaust structure 200 includes an intake section 210, a piping section 220, and an output section 230. In the embodiment depicted in FIG. 2, intake section 210 and piping section 220 are separate components mechanically coupled to each other at a section interface 215, and piping section 220 and output section 230 are separate components mechanically coupled to each other at a section interface 225.

In some embodiments, intake section 210 and piping section 220 are sections of a single component, and exhaust structure 200 does not include section interface 215. In some embodiments, piping section 220 and output section 230 are sections of a single component, and exhaust structure 200 does not include section interface 225.

FIG. 2 is a cross-sectional view of an embodiment in which each of intake section 210 and output section 230 has a curved cross-sectional profile within a plane of the cross-section. In various embodiments, one or both of intake section 210 or output section 230 has a curved cross-sectional profile in a plane other than that of the depicted cross-section. In various embodiments, one or both of intake section 210 or output section 230 is free of a curved cross-sectional profile.

Exhaust structure 200 has an overall length D1. In some embodiments, exhaust structure 200 has overall length D1 ranging from 10 centimeters (cm) to 30 cm. In some embodiments, exhaust structure 200 has overall length D1 ranging from 15 cm to 20 cm. In some embodiments, exhaust structure 200 has overall length D1 less than 10 cm. In some embodiments, exhaust structure 200 has overall length D1 greater than 30 cm.

Each of intake section 210, piping section 220, and output section 230 includes a high thermal conductivity material, as discussed above with respect to exhaust structure 130 and FIG. 1. In some embodiments, each of intake section 210, piping section 220, and output section 230 includes a same high thermal conductivity material. In some embodiments, each of intake section 210, piping section 220, and output section 230 includes one or more of aluminum, gold, silver, copper, graphene, diamond, or another material having a thermal conductivity greater than 200 W/m-K.

In some embodiments, each of intake section 210, piping section 220, and output section 230 includes a low emissivity coefficient material, as discussed above with respect to exhaust structure 130 and FIG. 1. In some embodiments, each of intake section 210, piping section 220, and output section 230 includes a same low emissivity coefficient material.

In some embodiments, each of intake section 210, piping section 220, and output section 230 includes one or more same materials, each of which is both a high thermal conductivity material and a low emissivity coefficient material. In some embodiments, the one or more same materials include aluminum, gold, silver, copper, or another material having a thermal conductivity greater than 200 W/m-K and an emissivity coefficient less than 0.10.

Intake section 210 has an inner volume 212 that extends from an inlet 214 to an outlet 216 and has a circular cross-sectional profile along inner volume 212. In some embodiments, intake section 210 has a cross-sectional profile of an oval or other non-circular shape for all or a portion of inner volume 212.

A smoothing layer 218 surrounds inner volume 212 and has an inner surface 219. Inner surface 219 defines a diameter D2 at inlet 214 and a diameter D3 at outlet 216. Smoothing layer 218 includes one or more materials that cause inner surface 219 to be a smooth surface having a low coefficient of friction. In operation, inner surface 219 thereby allows one or more gasses to flow through inner volume 212 with little interference.

In some embodiments, smoothing layer 218 includes Teflon. In some embodiments, smoothing layer 218 includes Teflon doped with carbon or tungsten. In some embodiments, smoothing layer 218 is a diamond characteristic coating that includes Teflon and narrow diamond crystal carbon.

In some embodiments, intake section 210 does not include smoothing layer 218, and inner surface 219 is an inner surface of intake section 210 itself.

Diameters D2 and D3 are sufficiently large and intake section 210 has a rounded corner so that inner volume 212 is defined to have a size and shape that, in operation, allow one or more gasses to flow through inner volume 212 with little constriction and little turbulence.

In some embodiments, diameters D2 and D3 have a same value. In some embodiments, diameters D2 and D3 have different values. In some embodiments, one or both of diameters D2 or D3 has a value ranging from 15 millimeters (mm) to 25 mm. In some embodiments, one or both of diameters D2 or D3 has a value ranging from 19 mm to 21 mm. In some embodiments, one or both of diameters D2 or D3 has a value less than 15 mm. In some embodiments, one or both of diameters D2 or D3 has a value greater than 25 mm.

Piping section 220 has an inner volume 222 that extends from an inlet 224 to an outlet 226 and has a circular cross-sectional profile along inner volume 222. In some embodiments, piping section 220 has a cross-sectional profile of an oval or other non-circular shape for all or a portion of inner volume 222.

A smoothing layer 228 surrounds inner volume 222 and has an inner surface 229. Inner surface 229 defines a diameter D4 from inlet 224 to outlet 226. Smoothing layer 228 includes one or more materials that cause inner surface 229 to be a smooth surface having a low coefficient of friction, as discussed above with respect to smoothing layer 218. In operation, inner surface 229 thereby allows one or more gasses to flow through inner volume 222 with little interference.

In some embodiments, piping section 220 does not include smoothing layer 228, and inner surface 229 is an inner surface of piping section 220 itself.

Diameter D4 is sufficiently large so that inner volume 222 is defined to have a size that, in operation, allows one or more gasses to flow through inner volume 222 with little constriction.

In some embodiments, diameter D4 has a value ranging from 15 cm to 25 cm. In some embodiments, diameter D4 has a value ranging from 19 mm to 21 mm. In some embodiments, diameter D4 has a value less than 15 mm. In some embodiments diameter D4 has a value greater than 25 mm.

Output section 230 has an inner volume 232 that extends from an inlet 234 to an outlet 236 and has a circular cross-sectional profile along inner volume 232. In some embodiments, output section 230 has a cross-sectional profile of an oval or other non-circular shape for all or a portion of inner volume 232.

A smoothing layer 238 surrounds inner volume 232 and has an inner surface 239. Inner surface 239 defines a diameter D5 at inlet 234 and a diameter D6 at outlet 236. Smoothing layer 238 includes one or more materials that cause inner surface 239 to be a smooth surface having a low coefficient of friction, as discussed above with respect to smoothing layer 218. In operation, inner surface 239 thereby allows one or more gasses to flow through inner volume 232 with little interference.

In some embodiments, output section 230 does not include smoothing layer 238, and inner surface 239 is an inner surface of output section 230 itself.

Diameters D5 and D6 are sufficiently large and output section 230 has a rounded corner so that inner volume 232 is defined to have a size and shape that, in operation, allow one or more gasses to flow through inner volume 232 with little constriction and little turbulence.

In some embodiments, diameters D5 and D6 have a same value. In some embodiments, diameters D5 and D6 have different values. In some embodiments, one or both of diameters D5 or D6 has a value ranging from 15 mm to 25 mm. In some embodiments, one or both of diameters D5 or D6 has a value ranging from 19 mm to 21 mm. In some embodiments, one or both of diameters D5 or D6 has a value less than 15 mm. In some embodiments, one or both of diameters D5 or D6 has a value greater than 25 mm.

Each of diameters D3, D4, and D5 has a same value such that an inner diameter of exhaust structure 200 is uniform from at least a portion of intake section 210 to at least a portion of output section 230. In some embodiments, each of diameters D2, D3, D4, and D5 has a same value such that an inner diameter of exhaust structure 200 is uniform from inlet 214 to at least a portion of output section 230. In some embodiments, each of diameters D3, D4, D5, and D6 has a same value such that an inner diameter of exhaust structure 200 is uniform from at least a portion of intake section 210 to outlet 236.

In the embodiment depicted in FIG. 2, diameters D3 and D4 having a same value corresponds to section interface 215 including a portion of intake section 210 at outlet 216 surrounding a portion of piping section 220 at inlet 224. In some embodiments, diameters D3 and D4 having a same value corresponds to section interface 215 including a portion of piping section 220 at inlet 224 surrounding a portion of intake section 210 at outlet 216. In some embodiments, diameters D3 and D4 having a same value corresponds to a configuration in which outlet 216 is otherwise mechanically coupled with inlet 224 at section interface 215.

In the embodiment depicted in FIG. 2, diameters D4 and D5 having a same value corresponds to section interface 225 including a portion of output section 230 at inlet 234 surrounding a portion of piping section 220 at outlet 226. In some embodiments, diameters D4 and D5 having a same value corresponds to section interface 225 including a portion of piping section 220 at outlet 226 surrounding a portion of output section 230 at inlet 234. In some embodiments, diameters D4 and D5 having a same value corresponds to a configuration in which outlet 226 is otherwise mechanically coupled with inlet 234 at section interface 225.

By the arrangement discussed above, exhaust structure 200 is configured to provide a high thermal conductivity path from inlet 214 to outlet 236 through intake section 210, piping section 220, and output section 230. Exhaust structure 200 is thereby configured so that, compared to thermal chamber systems that do not include a high thermal conductivity path from an inlet to an outlet, a temperature gradient between inlet 214 and outlet 236 is reduced. By having a reduced temperature gradient, buildup of condensate material in exhaust structure 200 is reduced compared to approaches that do not include a high thermal conductivity path from an inlet to an outlet, thereby reducing cleaning frequency and improving control of gas flow through exhaust structure 200.

In some embodiments in which exhaust structure 200 includes one or more low emissivity coefficient materials, heat transfer to one or more gasses in exhaust structure 200 is lowered and the temperature gradient is further reduced compared to approaches that do not include one or more low emissivity coefficient materials in an exhaust structure, thereby further reducing cleaning frequency and improving control of gas flow through exhaust structure 200.

In some embodiments in which exhaust structure 200 includes one or more smoothing layers 218, 228, or 238, resistance to the flow of one or more gasses in exhaust structure 200 is lowered, thereby reducing turbulence and condensation compared to approaches that do not include one or more smoothing layers in an exhaust structure, thereby further reducing cleaning frequency and improving control of gas flow through exhaust structure 200.

In some embodiments in which exhaust structure 200 includes one or more of intake structure 210 or output structure 230 having a curved cross-sectional profile, resistance to the flow of one or more gasses in exhaust structure 200 is lowered, thereby reducing turbulence and condensation compared to some approaches that do not include a curved cross-sectional profile in an exhaust structure, thereby further reducing cleaning frequency and improving control of gas flow through exhaust structure 200.

Figure 3:
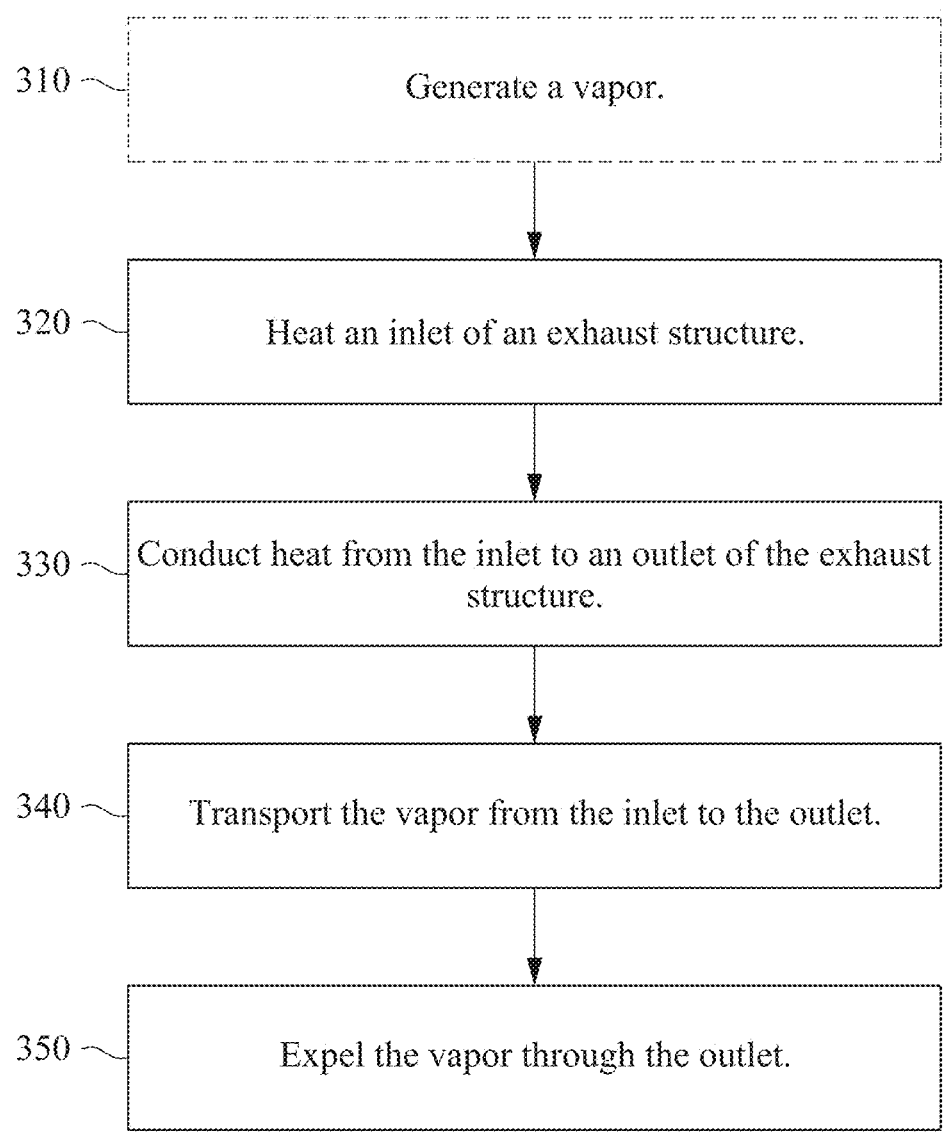
FIG. 3 is a flowchart of a method of exhausting a vapor, in accordance with some embodiments.

FIG. 3 is a flowchart of a method 300 of exhausting a vapor, in accordance with one or more embodiments. Method 300 is capable of being performed with a thermal chamber system e.g., thermal chamber system 100 discussed above with respect to FIG. 1, including an exhaust structure, e.g., exhaust structure 200 discussed above with respect to FIG. 2.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between, and/or after the operations depicted in FIG. 3.

In some embodiments, at operation 310, a vapor is generated. In some embodiments, generating a vapor includes generating a vapor using a hot plate. In some embodiments, generating a vapor includes generating a vapor using hot plate 114 discussed above with respect to thermal chamber system 100 and FIG. 1.

In some embodiments, generating a vapor includes heating a substrate. In some embodiments, heating a substrate includes heating a BARC layer on the substrate.

In some embodiments, generating a vapor includes releasing a solvent from a substrate. In some embodiments, generating a vapor includes releasing an additive from a substrate.

In some embodiments, generating a vapor is part of a photoresist-related IC manufacturing operation. In some embodiments, generating a vapor is part of an etch-related IC manufacturing operation.

At operation 320, an inlet of an exhaust structure is heated. In some embodiments, heating an inlet of an exhaust structure includes heating exhaust structure 130 discussed above with respect to FIG. 1. In some embodiments, heating an inlet of an exhaust structure includes heating exhaust structure 200 discussed above with respect to FIG. 2.

In some embodiments, heating an inlet of an exhaust structure includes heating the inlet through a low thermal resistance path from a hot plate. In some embodiments, heating an inlet of an exhaust structure includes heating the inlet using convection to transfer heat from a heat source such as a hot plate. In some embodiments, heating an inlet of an exhaust structure includes heating the inlet using a solid material such as a metal to transfer heat from a heat source such as a hot plate.

In some embodiments, heating an inlet of an exhaust structure includes heating inlet 132 of exhaust structure 130 through low thermal resistance path 115 from hot plate 114 discussed above with respect to FIG. 1.

At operation 330, heat is conducted from the inlet to an outlet of the exhaust structure. Conducting heat from the inlet to the outlet includes using a material having a high thermal conductivity. In some embodiments, conducting heat from the inlet to the outlet includes using a material having a thermal conductivity greater than 200 W/m-K. In some embodiments, conducting heat from the inlet to the outlet includes using aluminum.

In some embodiments, conducting heat from the inlet to the outlet includes using a material having a low emissivity coefficient. In some embodiments, conducting heat from the inlet to the outlet includes using a material having an emissivity coefficient ranging from 0.01 to 0.10.

In some embodiments, conducting heat from the inlet to the outlet includes conducting heat using exhaust structure 130 discussed above with respect to FIG. 1. In some embodiments, conducting heat from the inlet to the outlet includes conducting heat using exhaust structure 200 discussed above with respect to FIG. 2.

At operation 340, the vapor is transported from the inlet to the outlet. In some embodiments, transporting the vapor from the inlet to the outlet includes drawing the vapor into the inlet from a thermal chamber. In some embodiments, transporting the vapor from the inlet to the outlet includes drawing the vapor into the inlet from thermal chamber 110 discussed above with respect to thermal chamber system 100 and FIG. 1.

In some embodiments, transporting the vapor from the inlet to the outlet includes transporting the vapor using exhaust structure 130 discussed above with respect to FIG. 1. In some embodiments, transporting the vapor from the inlet to the outlet includes transporting the vapor using exhaust structure 200 discussed above with respect to FIG. 2.

In some embodiments, transporting the vapor from the inlet to the outlet includes transporting the vapor along one or more of smoothing layers 218, 228, or 238 of exhaust structure 200 discussed above with respect to FIG. 2.

In some embodiments, transporting the vapor from the inlet to the outlet includes transporting the vapor along a curved cross-sectional profile of one or more of intake structure 210 or output structure 230 of exhaust structure 200 discussed above with respect to FIG. 2.

At operation 350, the vapor is expelled through the outlet. In some embodiments, expelling the vapor through the outlet includes expelling the vapor through outlet 134 of thermal chamber system 100 discussed above with respect to FIG. 1. In some embodiments, expelling the vapor through the outlet includes expelling the vapor through outlet 236 of exhaust structure 200 discussed above with respect to FIG. 2.

The operations of method 300 are usable to exhaust a vapor using an exhaust structure while conducting heat along the exhaust structure using a high thermal conductivity path. Compared to approaches in which a vapor is exhausted without conducting heat using a high thermal conductivity path, a temperature gradient between the inlet and outlet of the exhaust structure is reduced. By having a reduced temperature gradient, buildup of condensate material in the exhaust structure is reduced compared to approaches that do not include conducting heat along a high thermal conductivity path, thereby reducing cleaning frequency and improving control of gas flow through the exhaust structure.

Compared to approaches that use a separate heat source to heat an exhaust structure, method 300 reduces a temperature gradient between an inlet and an outlet using less energy.

In some embodiments in which method 300 includes conducting heat using one or more low emissivity coefficient materials, heat transfer to one or more gasses in an exhaust structure is lowered and the temperature gradient is further reduced compared to approaches that do not include conducting heat using one or more low emissivity coefficient materials, thereby further reducing cleaning frequency and improving control of gas flow through the exhaust structure.

In some embodiments in which transporting the vapor includes transporting the vapor along one or more of smoothing layers 218, 228, or 238, resistance to the flow of one or more gasses is lowered, thereby reducing turbulence and condensation compared to approaches that do not include transporting the vapor along one or more smoothing layers, thereby further reducing cleaning frequency and improving control of gas flow through the exhaust structure.

In some embodiments in which transporting the vapor includes transporting the vapor along a curved cross-sectional profile of one or more of intake structure 210 or output structure 230, resistance to the flow of one or more gasses is lowered, thereby reducing turbulence and condensation compared to some approaches that do not include a curved cross-sectional profile in an exhaust structure, thereby further reducing cleaning frequency and improving control of gas flow through the exhaust structure.

An aspect of this description is related to an exhaust structure that includes an intake section where the intake section includes an inlet. An output section where the output section includes an outlet. A piping section is coupled to the intake section and the output section at a section interface. The piping section includes a first inner diameter from the intake section to the output section, wherein one of the intake section or the output section has a second inner diameter at the section interface. The second diameter includes a same value as a value of the first inner diameter. A plurality of smoothing layers are configured to resist turbulence and condensation produced by a flow of one or more gasses in the intake section, the output section, and the piping section.

Another aspect of this description is related to a thermal chamber system. The thermal chamber system includes a thermal chamber configured to contain a gas. A support structure is configured to support a substrate in the thermal chamber. The substrate is configured to emit one or more vapors in the thermal chamber. An exhaust structure is coupled to the thermal chamber. The exhaust structure includes an intake section where the intake section includes an inlet. The inlet is configured to receive the one or more vapors from the thermal chamber. An output section is coupled to the intake section where the output section includes an outlet. The outlet is configured to expel the one or more vapors from the exhaust structure. A plurality of smoothing layers are configured to transport the one or more vapors along the inlet to the outlet. The smoothing layers are arranged to have inner surfaces defining a first inner diameter of the intake section and a second inner diameter of the output section.

A further aspect of this description is related to an exhaust structure. The exhaust structure includes an intake section where the intake section includes an inlet. The inlet is configured to receive vapor transferred from a thermal chamber. An output section is coupled to the intake section where the output section includes an outlet. The outlet is configured to expel the vapor transferred from the thermal chamber. The intake section and the output section each are arranged to have a same inner diameter and a curved cross-sectional profile. The vapor is transported along the curved cross-sectional profiles of the intake section and the output section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An exhaust structure comprising:
   an intake section wherein the intake section includes an inlet;
   an output section wherein the output section includes an outlet;
   a piping section coupled to the intake section and the output section at a section interface, the piping section having a first inner diameter from the intake section to the output section, wherein one of the intake section or the output section having a second inner diameter at the section interface, the second diameter having a same value as a value of the first inner diameter; and
   a plurality of smoothing layers configured to resist turbulence and condensation produced by a flow of one or more gasses in the intake section, the output section, or the piping section.

2. The exhaust structure of claim 1, wherein the intake section and the output section each have a curved cross-sectional profile.

3. The exhaust structure of claim 1, wherein the intake section and the piping section are each sections of a single component.

4. The exhaust structure of claim 1, wherein the piping section, the intake section, and the output section each have the same high conductivity material.

5. The exhaust structure of claim 4, wherein the high conductivity material has a thermal conductivity greater than 200 W/m-K.

6. The exhaust structure of claim 1, wherein the one or more smoothing layers comprise Teflon doped with carbon or tungsten.

7. The exhaust structure of claim 1, wherein the one or more smoothing layers comprise a diamond characteristic coating.

8. A thermal chamber system comprising:
a thermal chamber configured to contain a gas;
a support structure configured to support a substrate in the thermal chamber, the substrate being configured to emit one or more vapors in the thermal chamber; and
an exhaust structure coupled to the thermal chamber, the exhaust structure comprising:
an intake section wherein the intake section includes an inlet, the inlet being configured to receive the one or more vapors from the thermal chamber;
an output section coupled to the intake section wherein the output section includes an outlet, the outlet being configured to expel the one or more vapors from the exhaust structure; and
a plurality of smoothing layers configured to transport the one or more vapors from the inlet to the outlet, wherein the smoothing layers are arranged to have inner surfaces defining a first inner diameter of the intake section and a second inner diameter of the output section.

9. The thermal chamber system of claim 8 further comprising a flow regulator configured to regulate a flow of the one or more vapors exiting the thermal chamber to the inlet.

10. The thermal chamber system of claim 9, wherein the flow regulator comprises a plurality of plates oriented perpendicular to a direction where the flow of the one or more vapors exits the thermal chamber.

11. The thermal chamber system of claim 10, wherein the thermal chamber comprises one or more vents configured to guide the one or more vapors to the inlet.

12. The thermal chamber system of claim 8, wherein the support structure comprises a disk having a substantially planar upper surface suitable for supporting and applying heat to the substrate.

13. The thermal chamber system of claim 8, wherein the support structure is configured to heat a bottom anti-reflective coating (BARC) layer of the substrate.

14. The exhaust structure of claim 8, wherein the outlet is coupled to a receptacle for receiving the one or more vapors expelled from the outlet.

15. The exhaust structure of claim 8, wherein the intake section comprises a first set of smoothing layers of the plurality of smoothing layers surrounding a first inner volume of the intake section having the first inner diameter.

16. The exhaust structure of claim 8, wherein the output section comprises a second set of smoothing layers of the plurality of smoothing layers surrounding a second inner volume of the output section having the second inner diameter.

17. An exhaust structure comprising:
an intake section wherein the intake section includes an inlet, the inlet being configured to receive vapor transferred from a thermal chamber; and
an output section coupled to the intake section wherein the output section includes an outlet, the outlet being configured to expel the vapor transferred from the thermal chamber, the intake section and the output section each arranged to have a same inner diameter and the same inner diameter having a curved cross-sectional profile, wherein the vapor is transported along the curved cross-sectional profiles of the intake section and the output section; and
a piping section coupled to the intake section and the output section, the piping section having a curved cross-sectional profile and an inner diameter, the inner diameter being the same as the inner diameter of the intake section and the output section.

18. The exhaust structure of claim 17, wherein the piping section and at least one of the intake section or the output section are sections of a single component.

19. The exhaust structure of claim 17, wherein the curved cross-sectional profile of each of the piping section, the intake section, and the output section has a non-circular shape.

20. The exhaust structure of claim 17, further comprising a smoothing layer along an inner surface of the intake section.

* * * * *